(12) United States Patent
Canova et al.

(10) Patent No.: US 7,061,733 B2
(45) Date of Patent: Jun. 13, 2006

(54) POWER SUPPLY CUT-OFF DEVICE FOR A POWER RECTIFIER

(75) Inventors: Antonio Canova, Arezzo (IT); Lorenzo Cincinelli, Arezzo (IT); Mauro Piazzesi, Arezzo (IT)

(73) Assignee: Magnetek S.p.A., Arezzo (IT)

( * ) Notice: Subject to any disclaimer, the term of this patent is extended or adjusted under 35 U.S.C. 154(b) by 433 days.

(21) Appl. No.: 10/402,690

(22) Filed: Mar. 28, 2003

(65) Prior Publication Data

US 2004/0008456 A1    Jan. 15, 2004

(30) Foreign Application Priority Data

Mar. 29, 2002   (EP)   ................... 02425196

(51) Int. Cl.
*H02H 7/00* (2006.01)
(52) U.S. Cl. ..................................... 361/18
(58) Field of Classification Search .................. 361/82, 361/84, 18
See application file for complete search history.

(56) References Cited

U.S. PATENT DOCUMENTS

| | | | |
|---|---|---|---|
| 4,532,443 A | | 7/1985 | Glennon ...................... 307/575 |
| 5,642,251 A | * | 6/1997 | Lebbolo et al. ............... 361/84 |
| 5,864,476 A | | 1/1999 | Busch .......................... 363/69 |
| 6,014,322 A | | 1/2000 | Higashi et al. ................ 363/65 |
| 6,043,965 A | * | 3/2000 | Hazelton et al. ............... 361/84 |
| 6,381,152 B1 | * | 4/2002 | Takahashi et al. ........ 363/21.06 |

FOREIGN PATENT DOCUMENTS

EP    1146620    10/2001

OTHER PUBLICATIONS

Fusion Engineering and Design, 58-59 (2001) 63-67, "Application of parallel connected power-MOSFET elements to high current d.c. power supply".

* cited by examiner

*Primary Examiner*—Brian Sircus
*Assistant Examiner*—Boris Benenson
(74) *Attorney, Agent, or Firm*—Waddey & Patterson, P.C.; Mark J. Patterson; Larry W. Brantley

(57) ABSTRACT

A power supply cut-off circuit for breaking a connection between a power rectifier and a power supply line leading to a load. The cut-off circuit is adapted to be connected between the power rectifier and the power supply line and includes a switching circuit connected to a control circuit. The control circuit is operable to sense a malfunction in the power rectifier and to use the switching circuit to disconnect the power rectifier from the power supply line. In one embodiment, the switching circuit includes a plurality of MOSFETs connected in parallel with one another and the control circuit disconnects the power rectifier from the power supply line by making the MOSFETs non-conducting when the power rectifier malfunctions and the output current of the power rectifier becomes inverted.

19 Claims, 1 Drawing Sheet

US 7,061,733 B2

POWER SUPPLY CUT-OFF DEVICE FOR A POWER RECTIFIER

This application claims benefit under 35 U.S.C. 119 (a) of co-pending European Application, Serial No. 02425196.9 filed Mar. 29, 2002, in the European Patent Office, entitled "Power Rectifier with Power Supply Cut-Off Means" which is hereby incorporated by reference.

Be it known that we, Antonio Canova, Lorenzo Cincinelli, and Mauro Piazzesi, Italian citizens residing in Arezzo, Italy, have invented a new and useful "Power Supply Cut-Off Device For A Power Rectifier."

BACKGROUND OF THE INVENTION

The present invention relates generally to a cut-off device for breaking the connection between a power rectifier connected to a supply line leading to a load when the power rectifier malfunctions.

Cut-off devices for power rectifiers are known in the art. These devices are typically used in conjunction with a plurality of power rectifiers connected in parallel to a single supply line leading to a load having considerable current requirements. If a fault occurs in one of the rectifiers, the cut-off device is used to prevent current flowing in the supply line from flowing into the faulty rectifier and causing severe disturbances in the common supply voltage, i.e., the bus output.

At the present time, cut-off devices usually include an arrangement of diodes connected to the output of the rectifier (on either the positive or the negative terminal) to prevent this problem from occurring. If current becomes inverted as a result of a fault in a rectifier, the diodes enter a cut-off state and prevent current from flowing into the faulty rectifier.

While these known devices have the advantage of rapid response speed, they also have high dissipation rates when high currents are present. This not only reduces efficiency, but also makes it necessary to provide efficient heat sinks, in thermal contact with the diodes, to remove the heat generated by the Joule effect in the diodes during the normal operation of the rectifier.

Thus, there is a need for a more efficient cut-off device for a power rectifier that does not have the drawbacks of conventional cut-off devices.

SUMMARY OF THE INVENTION

Accordingly, one object of the present invention is to provide a power rectifier cut-off device that does not have the drawbacks of conventional cut-off devices.

Another object is to provide a power rectifier cut-off device that is more efficient than conventional cut-off devices.

Still another object of the present invention is to provide a power rectifier having a more efficient cut-off circuit.

These objects, and other objects that will become apparent to someone practicing the present invention, are satisfied by a power rectifier cut-off device that, rather than simply including a set of diodes, includes a plurality of MOSFETs connected in parallel and a control circuit that makes the MOSFETs non-conducting when the output current from the rectifier tends to become inverted.

In a particularly advantageous embodiment of the invention, the control circuit includes an operational amplifier to whose inputs are applied voltages proportional to the source and drain voltages of the MOSFET. A reactive circuit with a capacitor is advantageously provided between the inverting terminal and the output of the operational amplifier in order to prevent oscillation of the output of the operational amplifier in the proximity of the trigger threshold at which the MOSFET becomes non-conducting.

Further advantageous characteristics and embodiments of the device according to the invention are indicated in the attached dependent claims.

The invention will be more clearly understood from the description and the attached drawing.

DESCRIPTION OF THE PREFERRED EMBODIMENTS

Figure 1:
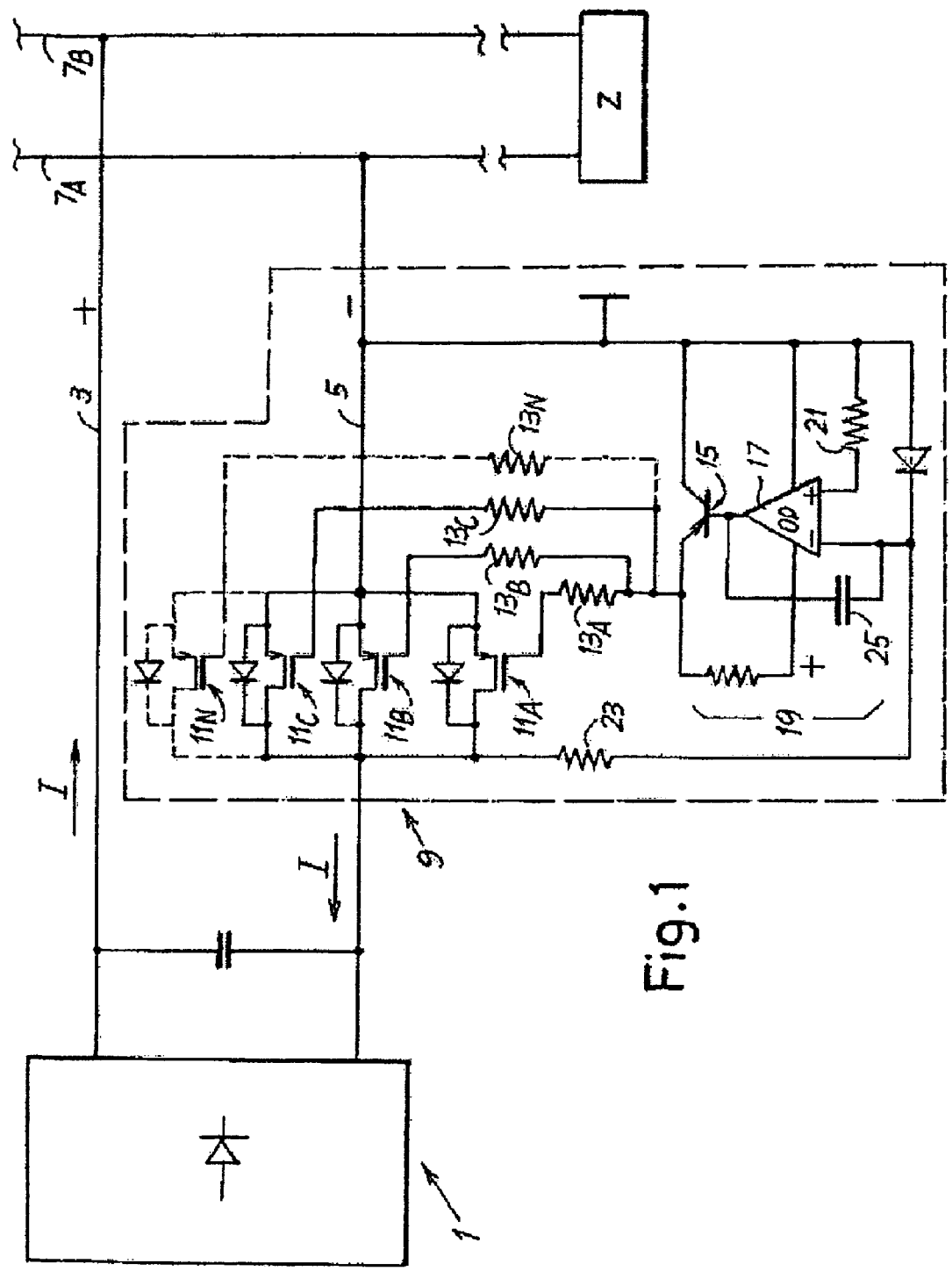
FIG. 1 is a drawing that shows, in a single FIGURE, an electrical circuit diagram of the cut-off device of the present invention.

Referring to FIG. 1, the number 1 indicates in a general and schematic way a power rectifier, whose internal structure is known to those skilled in the art and will not be described in detail in this document. The rectifier typically operates over a power range from hundreds to thousands of watts, e.g., at levels above 100 watts, and in particular, at levels above 400 watts, and with an output voltage which is typically of the order of several tens to several hundreds of volts.

The positive and negative terminals of the rectifier 1, indicated by 3 and 5 respectively, are connected to power supply lines 7A, 7B, which, in turn, are connected in parallel with other rectifiers that are similar to that illustrated in the FIGURE but not shown. The supply lines 7A, 7B are connected to a load indicated in a general and schematic way by Z.

The cut-off device associated with the power rectifier 1 can be connected to the positive output terminal 3 or to the negative output terminal 5 of the rectifier. In the example illustrated in the figure, it is connected to the negative terminal, and is indicated in a general way by 9. The cut-off device 9 includes a plurality of MOSFETs, indicated by 11A, 11B, 11C . . . 11N. The MOSFETs, 11A–11N, are connected in parallel with each other and are connected to the negative output terminal 5 of the rectifier in such a way that the current supplied by the latter is distributed among the various MOSFETs and flows between the source and drain of each of them.

The gates of all the MOSFETs are connected, via corresponding resistors 13A, 13B, 13C, and 13N to the emitter of a transistor 15. The collector of the transistor 15 is connected to the negative output terminal of the rectifier 1 before the group of MOSFETs 11A–11N, while the base of the transistor 15 is connected to the output of an operational amplifier 17. The operational amplifier 17 forms the main element of the control circuit, indicated as a whole by 19, associated with the MOSFETs 11A–11N.

The non-inverting input of the operational amplifier 17 is connected, via a resistor 21, to the negative output terminal of the rectifier 1 before the MOSFETs 11A–11N according to the conventional direction of flow of the current supplied by the rectifier. In a similar manner, the inverting terminal of the operational amplifier 17 is connected, via a resistor 23, to the negative output terminal 5 of the rectifier 1 after the MOSFETs 11A–11N.

A reactive filter containing a capacitor 25 is provided between the inverting terminal and the output of the operational amplifier 17. The reactive filter prevents oscillations of the output of the operational amplifier 17 when the output is close to the trigger threshold.

The operation of the circuit described above is as follows: In normal operating conditions, the rectifier 1 provides the supply lines, 7A, 7B, with a current I that is added to the current supplied by other rectifiers connected to the supply lines 7A, 7B and used to supply the load Z. In these conditions, a limited voltage drop is established between the source and drain of each MOSFET 11A–11N and is kept approximately constant until the value of the current tends toward zero. If the rectifier 1 suffers an internal fault, the current at the output of the rectifier may become inverted. As discussed above, this is a situation that must be avoided.

When this type of fault situation arises, the voltage drop between the sources and drains of the various MOSFETs 11A–11N causes a reduction of the output voltage of the operational amplifier 17. The reduction of the output voltage of the operational amplifier, in turn, causes the transistor 15 to conduct. Since the transistor 15 is connected via the resistors 13A–13N to the gates of the MOSFETs 11A–11N, it rapidly makes all the MOSFETs non-conducting when it switches to a conducting state. Thus, the connection between the supply lines 7A–7B and the power rectifier 1 is rapidly broken. The reactive filter formed by the capacitor 25 prevents any possible oscillations of the output of the operational amplifier 17 in the proximity of the intervention threshold.

It is to be understood that the drawing shows only an example provided solely as a practical demonstration of the invention. The example shown in the drawing may be varied with respect to its forms and arrangements without departing from the scope of the guiding principles of the present invention.

What is claimed is:

1. A power supply cut-off circuit for a power rectifier adapted to be connected to a power supply line leading to a load, comprising:
   a switching circuit adapted to be connected between the rectifier and the power supply line;
   a control circuit connected to the switching circuit, the control circuit including an operational amplifier having inputs connected across the switching circuit and a switching control element connected between an output of the operational amplifier and the switching circuit; and
   wherein, when the switching circuit has been connected between the rectifier and the power supply line,
      the control circuit is operable to disconnect the rectifier from the power supply line using the switching circuit when the control circuit senses that the rectifier has malfunctioned; and
      the operational amplifier is operable to apply a first signal indicative of a rectifier malfunction to the switching element that causes the switching control element to generate a second signal that causes the switching circuit to become nonconducting and disconnects the rectifier from the power supply line.

2. The cut-off of claim 1, wherein the switching circuit includes a plurality of switching elements connected in parallel with one another.

3. The cut-off of claim 2, wherein the switching circuit further includes a plurality of diodes connected in parallel with the plurality of switching elements.

4. The cut-off of claim 2, wherein the switching elements are MOSFETs.

5. The cut-off of claim 1, wherein the control circuit is operable to:
   sense a voltage across the switching circuit that is indicative of a rectifier malfunction; and
   disconnect the rectifier from the power supply line if the voltage across the switching circuit indicates that the rectifier has malfunctioned.

6. The cut-off of claim 5, wherein the control circuit determines that the rectifier has malfunctioned if the voltage across the switching circuit falls below a predetermined voltage level.

7. The cut-off of claim 1, wherein:
   the control circuit further includes a reactive filter connected to the operational amplifier; and
   the reactive filter is operable to prevent oscillations of the operational amplifier.

8. The cut-off of claim 7, wherein the switching control element is a transistor and the reactive filter is a capacitor.

9. A power rectifier having a power supply cut-off circuit and a rectifier output adapted to be connected to a power supply line for a load, the power supply cut-off circuit, comprising:
   a switching circuit adapted to be connected between the rectifier and the power supply line, the switching circuit including a plurality of switching elements connected in parallel with one another;
   a control circuit connected to the switching circuit, the control circuit including an operational amplifier having inputs connected across the switching circuit and a switching control element connected between an output of the operational amplifier and the switching circuit; and
   wherein, when the switching circuit has been connected between the rectifier and the power supply line,
      the control circuit is operable to disconnect the rectifier from the power supply line by causing the switching circuit to become nonconductive when the control circuit senses that the rectifier has malfunctioned; and
      the operational amplifier is operable to apply a first signal indicative of a rectifier malfunction to the switching control element that causes the switching control element to generate a second signal that causes the switching circuit to become nonconductive and disconnects from the power supply line.

10. The power rectifier of claim 9, wherein the control circuit is operable to
   sense a current flowing through the switching circuit that is indicative of a rectifier malfunction; and
   disconnect the rectifier from the power supply line if the current flowing through the switching circuit indicates that the rectifier has malfunctioned.

11. The power rectifier of claim 9, wherein the control circuit determines that the rectifier has malfunctioned if the current flowing through the switching circuit becomes inverted.

12. The power rectifier of claim 9, wherein the control circuit determines that the rectifier has malfunctioned if the current flowing through the switching circuit falls below a predetermined current level.

13. The power rectifier of claim 9, wherein the control circuit disconnects the rectifier from the power supply line by causing the switching circuit to block current flowing through the switching circuit.

14. A power supply cut-off circuit for a power rectifier having a rectifier output adapted to be connected to a power supply line for a load, comprising:

a plurality of MOSFETs connected in parallel and adapted to be connected to the rectifier output so that current flowing between the rectifier and the power supply line is distributed among the MOSFETs, each MOSFET having a gate;

a transistor having an emitter connected to each of the MOSFET gates, a collector adapted to be connected to the rectifier output between the plurality of MOSFETs and the power supply line, and a base; and an operational amplifier having an amplifier output connected to the base of the transistor, a non-inverting input adapted to be connected to the rectifier output between the plurality of MOSFETs and the power supply line, and an inverting input adapted to be connected to the rectifier output between the rectifier and the plurality of MOSFETs.

15. The power rectifier of claim 9, wherein the switching circuit includes a plurality of diodes connected in parallel with the plurality of switching elements.

16. The power rectifier of claim 15, wherein the switching elements are MOSFETs.

17. A power supply cut-off circuit for a power rectifier having a rectifier output adapted to be connected to a power supply line for a load, comprising:

a plurality of MOSFETs connected in parallel and adapted to be connected to the rectifier output so that current flowing between the rectifier and the power supply line is distributed among the MOSFETs, a source-drain voltage existing across the MOSFETs;

an operational amplifier with an inverting input and a non-inverting input, a voltage proportional to the source-drain voltage across the MOSFETs being applied across the inverting and non-inverting inputs of the operational amplifier; and wherein, the operational amplifier is operable to generate a first signal indicative of a rectifier malfunctioning that can be used to make the MOSFETs non-conducting.

18. The power rectifier of claim 17, wherein:

a switching control element is connected between an output of the operational amplifier and the switching circuit; and the operational amplifier is operable to apply the first signal indicative of a rectifier malfunctioning to the switching control element; and the first signal indicative of a rectifier malfunction causes the switching control element to generate a second signal that causes the switching circuit to become nonconducting and disconnects the rectifier form the power supply line.

19. The power supply cut-off circuit of claim 18, wherein:

each one of the plurality of MOSFETs includes a gate;

the switching control element is a transistor and the transistor is connected to the gates of the MOSFETs;

the transistor becomes conducting in response to the first signal indicative of a rectifier malfunctioning generated by the operational amplifier, generates the second signal, and applies the second signal to the gates of the MOSFETs; and the MOSFETs become nonconducting in response to the second signal being applied to the gates of the MOSFETs by the transistor.

* * * * *